US007353907B2

(12) United States Patent
Whitaker

(10) Patent No.: US 7,353,907 B2
(45) Date of Patent: Apr. 8, 2008

(54) SPEAKER ENCLOSURE FOR A WALL MOUNTED SPEAKER SYSTEM

(76) Inventor: Scott R. Whitaker, 5550 Lindenwood La., Fairfield, OH (US) 45014

( * ) Notice: Subject to any disclaimer, the term of this patent is extended or adjusted under 35 U.S.C. 154(b) by 250 days.

(21) Appl. No.: 11/204,734

(22) Filed: Aug. 16, 2005

(65) Prior Publication Data

US 2007/0039777 A1 Feb. 22, 2007

(51) Int. Cl.

| | |
|---|---|
| ***H05K 5/02*** | (2006.01) |
| ***H05K 5/06*** | (2006.01) |
| ***H04R 1/02*** | (2006.01) |
| ***H04R 1/28*** | (2006.01) |
| *H05K 5/00* | (2006.01) |

(52) U.S. Cl. ...................... 181/150; 181/151; 381/345; 381/353; 381/354

(58) Field of Classification Search ................ 181/150, 181/151, 146; 381/386, 87, 345, 353, 354, 381/333, 388

See application file for complete search history.

(56) References Cited

U.S. PATENT DOCUMENTS

| | | | | | |
|---|---|---|---|---|---|
| 1,844,802 | A | * | 2/1932 | Seabert | 381/348 |
| 2,186,276 | A | * | 1/1940 | Schwarz et al. | 181/150 |
| 2,744,584 | A | | 5/1956 | Hellon | |
| 2,821,260 | A | | 1/1958 | Shaffer | |
| 3,059,720 | A | * | 10/1962 | Matsuoka | 381/420 |
| 3,985,200 | A | * | 10/1976 | Sepmeyer | 181/150 |
| 4,057,689 | A | * | 11/1977 | Stallings, Jr. | 381/335 |
| 4,161,995 | A | * | 7/1979 | Pohlmann et al. | 181/150 |
| 4,296,280 | A | | 10/1981 | Richie | |
| 4,312,258 | A | * | 1/1982 | Park | 84/743 |
| 4,330,691 | A | * | 5/1982 | Gordon | 381/335 |
| 4,433,749 | A | * | 2/1984 | Watkins et al. | 181/151 |
| 4,437,541 | A | * | 3/1984 | Cross | 181/151 |
| 4,439,644 | A | * | 3/1984 | Bruney, III | 181/151 |
| 4,509,192 | A | * | 4/1985 | Straughn | 381/348 |
| 4,640,381 | A | | 2/1987 | Tsuchiya et al. | |
| 4,853,966 | A | * | 8/1989 | Skrzycki | 381/395 |
| 4,891,842 | A | * | 1/1990 | Green | 381/392 |
| 4,903,300 | A | | 2/1990 | Polk | |
| 4,923,032 | A | * | 5/1990 | Nuernberger | 181/150 |
| 5,082,083 | A | | 1/1992 | Draffen | |
| 5,138,656 | A | * | 8/1992 | Shanes | 379/167.11 |
| 5,206,464 | A | * | 4/1993 | Lamm et al. | 181/150 |
| 5,979,591 | A | * | 11/1999 | Harrison | 181/199 |
| 6,098,743 | A | * | 8/2000 | McGrath | 181/150 |
| 6,550,570 | B2 | | 4/2003 | Combest | |
| 6,609,589 | B2 | | 8/2003 | Combest | |
| 6,687,380 | B1 | | 2/2004 | Vishwamitra | |
| 2003/0048918 | A1 | * | 3/2003 | Dillon et al. | 381/395 |

FOREIGN PATENT DOCUMENTS

| | | | | |
|---|---|---|---|---|
| CH | 681144 | A5 | * | 1/1993 |
| JP | 55089901 | A | * | 7/1980 |
| JP | 60043994 | A | * | 3/1985 |

* cited by examiner

*Primary Examiner*—Edgardo San Martin
(74) *Attorney, Agent, or Firm*—William M. Hobby, III

(57) ABSTRACT

A process and kit is provided for retro-installing a speaker enclosure for a wall mounted speaker. The process includes mounting a selected speaker surround member in a building wall between the front and back wall surfaces and between the wall studs and around the opening for a wall mounted speaker and adhesively mounting a selected sheet of vibration dampening material to the back wall surface behind the opening for the wall mounted speaker and attaching a flexible sound absorbent material to the vibration dampening material so that a wall mounted speaker enclosure is installed in an existing building wall.

17 Claims, 2 Drawing Sheets

SPEAKER ENCLOSURE FOR A WALL MOUNTED SPEAKER SYSTEM

BACKGROUND OF THE INVENTION

The present invention relates to a speaker enclosure kit for retro-installing a speaker enclosure for a wall mounted speaker in an existing wall and to a process of retro-installing the speaker enclosure for a wall mounted speaker in an existing wall.

Typical building walls, such as in homes, commonly have in-wall speakers prewired and mounted in the wall of the building to provide improved fidelity from a high-fidelity sound system or from a home entertainment system including providing surround sound for television sets and the like. Most modern stereo and high fidelity sound home entertainment systems, including television sets, come equipped with connections for the connection of a remote pair of speakers. The connection is provided to allow the operation of an additional pair of stereo speakers in a different room of the building or in the same room as the principal speakers. It has been common to prewire homes for mounting in-wall speakers. The installation of the speakers is in the nominal spacing between adjacent wall studs of a home and where the depth of a speaker enclosure can be no greater than the width of a standard 2×4" wall stud in which the exterior surfaces of the wall are flush with the studs. This provides a very limited space for the mounting of a speaker. The wide variety of such speakers have been provided in the past and are specifically designed to be mounted through one side of the wall by cutting an opening in the wall, such as through, a dry wall panel, and attaching the speaker therein flush with the wall so that a decorative grill can be mounted over the speaker.

Typically, the speaker is mounted through one side of a dry wall panel in a wall and between the standard 2×4" wall studs, which are typically spaced 16" on center. Most speakers use the entire inside of a wall between the pair of studs where the speaker is mounted as a speaker enclosure to handle the backwave of the speaker which is an elongated narrow box formed of drywall attached to building studs. This enclosure for the speaker is somewhat inadequate in dealing with the speaker's woofer portion and in absorbing the backwave or dampening the vibrations from the speaker.

It is accordingly an object of the present invention to provide a speaker enclosure that can be added to a existing in-wall mounted speaker without any destruction or damaging of the existing wall and which dampens vibration and absorbs the sound energy eminating from the rear of the speaker mounted in the wall.

Prior U.S. patents which have attempted to form an enclosure in a wall for a wall speaker include U.S. Pat. Nos. 6,609,589 and 6,550,570 to Combest for a speaker enclosure and mounting method for isolating and insulating a faceplate and heavy speakers from surrounding mounting surfaces. This system, in essence, removes a fairly large section of a dry wall between a pair of studs for attaching the speakers and a recessed speaker box. In the U.S. Pat. No. 4,296,280 to Richie, a wall mounted speaker system operates in a similar manner to the Combest patents in that a large opening is cut into one side of a wall between the wall studs for mounting the speakers and a speaker enclosure. In the J. B. Hellon U.S. Pat. No. 2,744,584, a public address housing assembly is provided for loudspeakers and incorporates the assemblies in a wall or a ceiling of a building to provide an installation substantially flush with the supporting wall or ceiling. The E. E. Shaffer U.S. Pat. No. 2,821,260 shows a built-in sound system for a home in which a speaker box is mounted through a panel of the wall for attaching a speaker thereto. The Tsuchiya et al. U.S. Pat. No. 4,640,381 is a wall mounted resin speaker cabinet while the Draffen U.S. Pat. No. 5,082,083 is a structure wall mounted speaker assembly.

In the Vishwamitra U.S. Pat. No. 6,687,380 an active sub-woofer speaker system is provided for an in-wall construction. In the Polk U.S. Pat. No. 4,903,300 a sub-woofer system and method for installation in a structural partition is provided for a loudspeaker system which is installed in a space between a front panel and an enclosed area behind the front panel of a partition wall or ceiling.

These prior art wall mounted speaker enclosures typically require cutting a very large opening in a wall in order to mount the speaker enclosure or premounting the speaker enclosure during the construction of the wall.

SUMMARY OF THE INVENTION

A speaker enclosure kit for retro-installing a speaker enclosure for a wall mounted speaker is provided along with a process of retro-installing a speaker enclosure for a wall mounted speaker. The speaker enclosure kit includes a speaker surround member having a foamed polymer, such as a urethane foam, attached to both sides of a flexible polymer strip, such as a vinyl strip, and sized to fit through a wall speaker shaped to fit between the front wall and back wall surfaces and between the studs of a wall and around the opening for a wall mounted speaker. A sheet of vibration dampening material, such as a laminated aluminum and butyl sheet, is sized to fit through a wall speaker opening for attaching to the back wall surface behind the opening for a wall mounted speaker. A flexible sound absorbent material, such as a rubber or butyl sheet, can also fit through the wall speaker opening for attachment to the vibration dampening material. The kit allows a wall mounted speaker enclosure to be installed in an existing wall through a wall mounted speaker opening.

The process of retro-installing a speaker enclosure includes selecting the speaker enclosure kit of the apparatus claims and mounting the selected speaker surround member in a wall between the front and back wall surfaces and between the wall studs and around the opening for a wall mounted speaker and mounting a selected sheet of vibration dampening material to the back wall surface behind the opening for the wall mounted speaker and attaching the flexible sound absorbent material to the vibration dampening material so that a wall mounted speaker enclosure is installed in an existing wall.

BRIEF DESCRIPTION OF THE DRAWINGS

Other objects, features, and advantages of the present invention will be apparent from the written description and the drawings in which.

DETAILED DESCRIPTION OF THE PREFERRED EMBODIMENT

Figure 1:
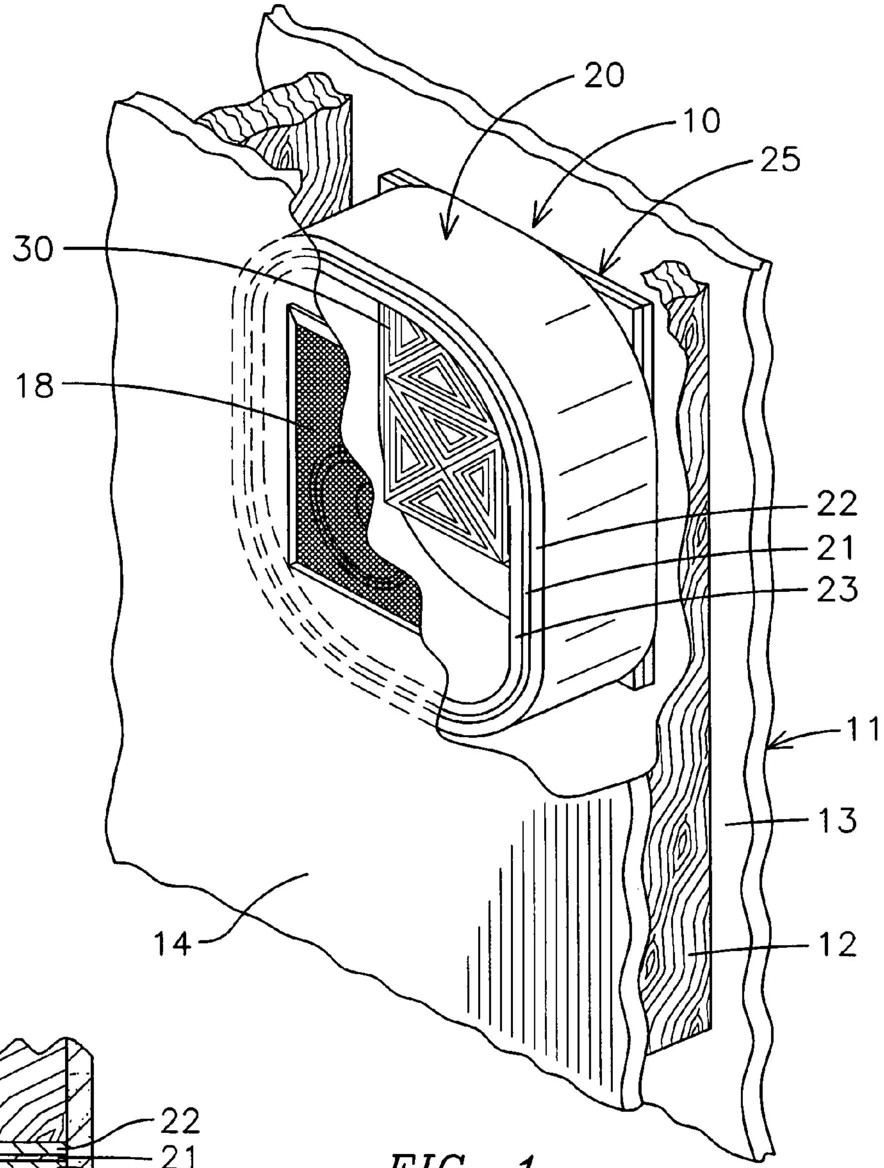
FIG. 1 is a cutaway perspective view of an installed speaker enclosure for a wall mounted speaker in accordance with the present invention.
Figure 2:
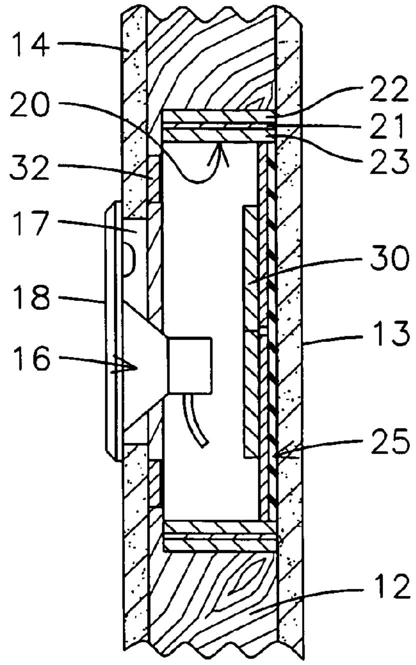
FIG. 2 is a sectional view taken through a wall having the speaker enclosure of the present invention installed.
Figure 3:
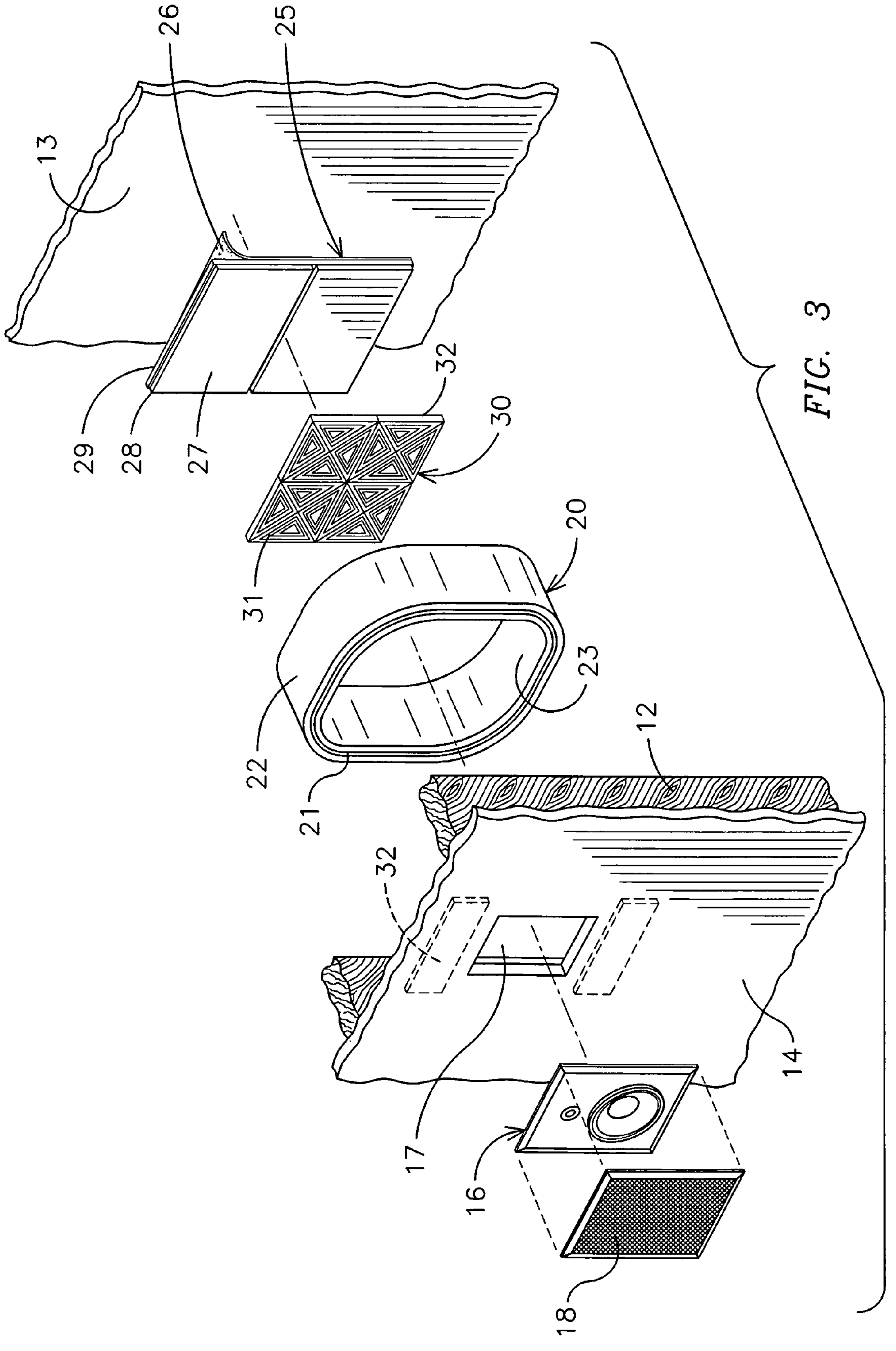
FIG. 3 is an exploded view of the wall mounted speaker enclosure in accordance with the present invention.

Referring to the drawings FIGS. 1-3, an installed in-wall speaker enclosure 10 is mounted within a building wall 11. The building wall is comprised of a plurality of vertically extending studs, such as 2×4" wooden studs 12 having a dry wall panel 13 forming a back wall and a dry wall panel 14 forming a front wall. Panels 13 and 14 are attached to the studs 12 leaving an elongated hollow space 15 in the wall between the studs. Typically, in-wall speakers 16 are attached through an opening 17 cut in the front panel 14. The mounted speaker 16 has a speaker grill 18 covering the front thereof. The open space 15 is left intact in the installation of most in-wall speakers.

In the present case, the in-wall speaker 16 has a rear enclosure 10 in the wall 11 which may be installed through the opening 17 of an existing in-wall installed dynamic speaker. The enclosure includes a speaker surround member 20 which is flexible enough that it can be folded or snaked through the opening 17 in the wall 11 and expanded to form a speaker surround member surrounding the speaker opening 17 between the studs 12 and between the wall panels 13 and 14. The speaker surround member 20 is formed of a polymer strip 21, such as a vinyl strip, which is sufficiently flexible that it can be bent, if desired, sufficiently to make it pass through a speaker opening 17. The vinyl strip 21 has a foam polymer outer side 22 and a foam polymer inside 23 thereby covering both sides of the polymer strip 21 with a foamed polymer strip. The foam polymer which may be a polyurethane foam, placed on both sides of a strip of vinyl. This speaker surround member may be formed of one complete enclosure but typically would be formed of one long strip which can be slid through the opening 17 in the front panel 14 and then positioned around the speaker opening where it is press fitted between the panels 13 and 14 and between the studs. A vibration dampening panel 25 may be formed as connected panels, as shown in FIG. 3, and has an adhesive coating placed on the rear 29 of the panel or panels and has a peel-off wax paper or other cover 26 covering the adhesive coating. The cover 26 can be peeled off and the panel 25 inserted through the opening 17 and attached to the back dry wall panel 13. A vibration dampening panel 25 may be formed of an aluminum sheet 27 covering a butyl sheet 28 and laminated together. Once the vibration dampening panel 25 is attached to the back dry wall panel 13, a flexible sound absorbing sheet 30, which may be a flexible rubber, butyl or other sound absorbing panel, can be folded and slipped through the opening 17 and is attached directly over the vibration dampening panel 25. The sound absorbing panel is a rubberized material having a sound absorbing surface 31 thereon and, as can be seen, is directly behind the mounted speaker 16, as shown in FIG. 2. Additional vibration dampening panels 32 can be attached inside the wall to the front panel 14 above and below the speaker opening 17 to provide additional vibration dampening to the front panel. Vibration dampening panels 32 can be a laminated aluminum and butyl sheet which is adhesively attached to the front panel 14 after passing the vibration dampening panels through the opening 17.

As can be seen, the present wall mounted speaker enclosure system is provided in a kit for an installer which kit includes the speaker surround member 20 and a plurality of vibration dampening panels 25 for placing on the back wall panel 13 and on the front wall panel 14 and a flexible sound absorbing panel 30 having a specific design and being made of a soft rubber for absorbing sound from the rearwave of the electro-dynamic speaker 16. When assembled, as shown in the drawings, the speaker forms a complete speaker enclosure within the walls between the panels 13 and 14 and between the studs 12, which is both vibration dampening and sound absorbing of the backwave of the speaker 16.

The installation of the speaker enclosures requires taking the speaker surround member 20 and snaking it through the opening 17 and positioning around the opening 17 and removing the peel off cover 26 covering the adhesive 29 on the back of the vibration dampening panel 25 and inserting the individual panels through the opening 17 and adhesively attaching to the back panel 13. The vibration dampening panels 32 are attached to the front dry wall panel 14. The sound absorbing sheet 30, which may also have an adhesive coating on the rear 32 thereof can then be folded and inserted through the opening 17 and attached directly over the vibration dampening panels 25 on the rear of wall panel 13. The speaker 16 may then be remounted to the wall through the speaker openings. 17 and the decorative grill 18 placed thereover. The speaker enclosure of the present type enhances the sound of the speaker system by reducing vibrations in the building wall panels 13 and 14 and by absorbing the rearwave of the woofer portion of the electrodynamic speakers 16.

It should be clear at this point that a wall mounted speaker enclosure system which can be provided in a speaker enclosure kit for retro-installing a speaker enclosure for a wall mounted speaker has been provided as well as the process of retro-installing a speaker enclosure for the wall mounted speaker. However, the present invention is not to be construed as limited to the forms shown which are to be considered illustrative rather than restrictive.

I claim:

1. A process of retro-installing a speaker enclosure for a wall mounted speaker through a wall opening for the sneaker comprising the steps of:

selecting a speaker surround member of a foamed polymer attached to a polymer strip;

snaking said selected speaker surround member through said speaker opening in a building wall surface;

mounting said selected speaker surround member in the building wall between front and back building wall surfaces and around the opening for a wall mounted speaker;

selecting a sheet of vibration dampening material;

adhesively inserting said selected sheet of vibration dampening material through said speaker opening in said building wall surface;

mounting said selected sheet of vibration dampening material to the building back wall surface behind the opening for a wall mounted speaker;

whereby a wall mounted speaker enclosure is installed in an existing building wall through a speaker opening in the building wall.

2. The process of retro-installing a speaker enclosure for a wall mounted speaker in accordance with claim 1 in which the selected speaker surround material has a foamed polymer attached to both sides of a polymer strip.

3. The process of retro-installing a speaker enclosure for a wall mounted speaker in accordance with claim 2 in which the selected speaker surround material has a foamed polyurethane attached to both sides of a polymer strip.

4. The process of retro-installing a speaker enclosure for a wall mounted speaker in accordance with claim 3 in which the selected speaker surround material polymer strip is strip of vinyl.

5. The process of retroinstalling a speaker enclosure for a wall mounted speaker in accordance with claim 4 including the step of mounting a sound absorbent material onto said vibration dampening material.

6. The process of retro-installing a speaker enclosure for a wall mounted speaker in accordance with claim 5 in which the selected vibration dampening material is aluminum sheet having a butyl strip laminated thereto.

7. The process of retro-installing a speaker enclosure for a wall mounted speaker in accordance with claim 6 in which said sound absorbent material is a rubber compound.

8. The process of retro-installing a speaker enclosure for a wall mounted speaker in accordance with claim 7 in which the said of vibration absorbent material has an adhesive coating thereon covered with a protective cover.

9. The process of retro-installing a speaker enclosure for a wall mounted speaker in accordance with claim 8 including the step of attaching said vibration absorbent material on the back side of the front wall adjacent said speaker opening.

10. A speaker enclosure kit for retro-installing a speaker enclosure for a wall mounted speaker comprising:

a foldable speaker surround member having a foamed polymer attached to both sides of a flexible polymer strip and sized to fit through a wall speaker opening when folded and shaped to fit between the wall front and back wall surfaces when unfolded and to be mounted around the opening for a wall mounted speaker;

a sheet of vibration dampening material having a metal sheet having a rubber strip laminated thereto and sized to fit through a wall speaker opening for attachment to the back wall surface behind the opening for a wall mounted speaker; and a flexible sound absorbent material sized to fit through a wall speaker opening for attachment to said vibration dampening material;

whereby a wall mounted speaker enclosure can be installed in an existing wall through a wall mounted speaker opening.

11. The speaker enclosure kit for retro-installing a speaker enclosure for a wall mounted speaker in accordance with claim 10 in which said speaker surround material has a foamed polymer attached to both sides of said polymer strip.

12. The speaker enclosure kit for retro-installing a speaker enclosure for a wall mounted speaker in accordance with claim 11 in which said speaker surround material has foamed polyurethane attached to both sides of a polymer strip.

13. The speaker enclosure kit for retro-installing a speaker enclosure for a wall mounted speaker in accordance with claim 12 in which said speaker surround material has foamed polyurethane attached to both sides of a vinyl strip.

14. The speaker enclosure kit for retro-installing a speaker enclosure for a wall mounted speaker in accordance with claim 13 in which said vibration dampening material metal sheet is an aluminum sheet.

15. The speaker enclosure kit for retro-installing a speaker enclosure for a wall mounted speaker in accordance with claim 14 in which said sound absorbent material is a butyl rubber compound.

16. The speaker enclosure kit for retro-installing a speaker enclosure for a wall mounted speaker in accordance with claim 15 in which said vibration absorbent material has an adhesive coating thereon covered with a protective cover.

17. The speaker enclosure kit for retro-installing a speaker enclosure for a wall mounted speaker in accordance with claim 16 including a pair of vibration absorbent material strips sized to fit through said wall mounted speaker opening for attachment to the back side of the front wall adjacent said speaker opening.

* * * * *